(12) United States Patent
Surthi

(10) Patent No.: US 9,111,853 B2
(45) Date of Patent: Aug. 18, 2015

(54) METHODS OF FORMING DOPED ELEMENTS OF SEMICONDUCTOR DEVICE STRUCTURES

(71) Applicant: Micron Technology, Inc., Boise, ID (US)

(72) Inventor: Shyam Surthi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/840,683

(22) Filed: Mar. 15, 2013

(65) Prior Publication Data

US 2014/0264754 A1 Sep. 18, 2014

(51) Int. Cl.

| H01L 21/22 | (2006.01) |
|---|---|
| H01L 21/38 | (2006.01) |
| H01L 21/225 | (2006.01) |
| H01L 29/417 | (2006.01) |
| H01L 29/66 | (2006.01) |
| H01L 29/08 | (2006.01) |
| H01L 27/108 | (2006.01) |

(52) U.S. Cl.
CPC ........ H01L 21/2257 (2013.01); H01L 29/0847 (2013.01); H01L 29/41741 (2013.01); H01L 29/66666 (2013.01); H01L 27/10873 (2013.01); H01L 27/10885 (2013.01)

(58) Field of Classification Search
USPC ......... 438/558, 559, 560, 561, 562, 563, 564;
257/607, 608, 609, 610, 611, 612,
257/E21.056, E21.057, E21.135, E21.142,
257/E21.147, E21.144, E21.145, E21.152,
257/E21.466, 532
See application file for complete search history.

(56) References Cited

U.S. PATENT DOCUMENTS

| 3,562,022 A | 2/1971 | Shifrin |
|---|---|---|
| 3,865,624 A | 2/1975 | Wilde |
| 4,569,701 A * | 2/1986 | Oh ................................. 438/389 |
| 4,673,962 A | 6/1987 | Chatterjee et al. |

(Continued)

FOREIGN PATENT DOCUMENTS

| KR | 10-2004-0055142 A | 6/2004 |
|---|---|---|
| WO | 2007059577 A1 | 5/2007 |
| WO | 2014035568 A1 | 3/2014 |

OTHER PUBLICATIONS

Bernstein et al., Effects of Dopant Deposition on p+/n and n+/p Shallow Junctions Formed by Plasma Immersion Ion Implantation, IEEE, pp. 464-467 (2000).

(Continued)

*Primary Examiner* — Eva Y Montalvo
*Assistant Examiner* — Samuel Lair
(74) *Attorney, Agent, or Firm* — TraskBritt

(57) ABSTRACT

Methods of forming doped elements of semiconductor device structures include forming trenches having undercut portions separating stem portions of a substrate. The stem portions extend between a base portion of the substrate and overlying broader portions of the substrate material. A carrier material including a dopant is formed at least on the sides of the stems in the undercut portions of the trenches. The dopant is diffused from the carrier material into the stems. As such, the narrow stem portions of the substrate become doped with a targeted dopant-delivery method. The doped stems may form or be incorporated within buried, doped, conductive elements of semiconductor device structures, such as digit lines of memory arrays. Also disclosed are related semiconductor device structures.

17 Claims, 6 Drawing Sheets

(56) References Cited

U.S. PATENT DOCUMENTS

| | | | |
|---|---|---|---|
| 4,764,394 A | | 8/1988 | Conrad |
| 4,845,051 A | * | 7/1989 | Cogan et al. .......... 438/193 |
| 4,920,390 A | | 4/1990 | Fuse et al. |
| 5,374,456 A | | 12/1994 | Matossian et al. |
| 5,508,212 A | | 4/1996 | Wang et al. |
| 5,627,390 A | | 5/1997 | Maeda et al. |
| 5,672,541 A | | 9/1997 | Booske et al. |
| 5,770,875 A | * | 6/1998 | Assaderaghi et al. ........ 257/301 |
| 5,828,094 A | | 10/1998 | Lee |
| 5,897,363 A | | 4/1999 | Gonzalez et al. |
| 6,137,713 A | | 10/2000 | Kuroda et al. |
| 6,207,493 B1 | * | 3/2001 | Furukawa et al. .......... 438/246 |
| 6,225,151 B1 | | 5/2001 | Gardner et al. |
| 6,329,686 B1 | | 12/2001 | Lowrey et al. |
| 6,417,040 B2 | | 7/2002 | Noble |
| 6,492,245 B1 | | 12/2002 | Liu et al. |
| 6,504,201 B1 | | 1/2003 | Noble et al. |
| 6,563,162 B2 | | 5/2003 | Han et al. |
| 6,582,998 B2 | | 6/2003 | Nitta |
| 6,593,612 B2 | | 7/2003 | Gruening et al. |
| 6,600,191 B2 | | 7/2003 | Lowrey et al. |
| 6,639,846 B2 | | 10/2003 | Nikutta |
| 6,689,660 B1 | | 2/2004 | Noble et al. |
| 6,716,727 B2 | | 4/2004 | Walther |
| 6,977,417 B2 | | 12/2005 | Momiyama et al. |
| 6,992,349 B2 | | 1/2006 | Lee et al. |
| 7,015,091 B1 | | 3/2006 | Wu |
| 7,052,941 B2 | | 5/2006 | Lee |
| 7,074,656 B2 | | 7/2006 | Yeo et al. |
| 7,099,174 B2 | | 8/2006 | Thompson et al. |
| 7,118,997 B2 | * | 10/2006 | Furukawa et al. .......... 438/528 |
| 7,129,538 B2 | | 10/2006 | Lee et al. |
| 7,166,479 B2 | | 1/2007 | Zhu et al. |
| 7,179,703 B2 | | 2/2007 | Gonzalez et al. |
| 7,365,384 B2 | | 4/2008 | Tran et al. |
| 7,456,068 B2 | | 11/2008 | Kavalieros et al. |
| 7,491,641 B2 | | 2/2009 | Southwick et al. |
| 7,501,676 B2 | | 3/2009 | Doyle |
| 7,518,182 B2 | | 4/2009 | Abbott et al. |
| 7,592,212 B2 | | 9/2009 | Qin et al. |
| 7,709,341 B2 | | 5/2010 | Fucsko et al. |
| 7,713,823 B2 | * | 5/2010 | Sung et al. .......... 438/272 |
| 7,736,969 B2 | | 6/2010 | Abbott et al. |
| 7,737,010 B2 | | 6/2010 | Qin et al. |
| 7,768,073 B2 | | 8/2010 | Wells |
| 7,939,409 B2 | | 5/2011 | Figura et al. |
| 7,948,064 B2 | | 5/2011 | Barth et al. |
| 7,956,402 B2 | | 6/2011 | Chen et al. |
| 8,008,158 B2 | | 8/2011 | Chang et al. |
| 8,361,856 B2 | | 1/2013 | Heineck et al. |
| 8,569,831 B2 | * | 10/2013 | Heineck et al. .......... 257/329 |
| 8,609,488 B2 | * | 12/2013 | Guha et al. .......... 438/259 |
| 2002/0110039 A1 | | 8/2002 | Forbes et al. |
| 2003/0096490 A1 | | 5/2003 | Borland et al. |
| 2003/0107911 A1 | | 6/2003 | Nishihara et al. |
| 2003/0186519 A1 | | 10/2003 | Downey |
| 2004/0132232 A1 | | 7/2004 | Noble |
| 2004/0195594 A1 | | 10/2004 | Tran et al. |
| 2005/0017281 A1 | | 1/2005 | Lowrey |
| 2005/0079721 A1 | | 4/2005 | Buerger et al. |
| 2005/0260838 A1 | | 11/2005 | Downey et al. |
| 2006/0017088 A1 | | 1/2006 | Abbott et al. |
| 2006/0059449 A1 | | 3/2006 | Yang et al. |
| 2006/0081884 A1 | | 4/2006 | Abbott et al. |
| 2006/0249770 A1 | | 11/2006 | Huo et al. |
| 2007/0082448 A1 | * | 4/2007 | Kim et al. .......... 438/268 |
| 2007/0087574 A1 | | 4/2007 | Gupta et al. |
| 2007/0243680 A1 | | 10/2007 | Harari et al. |
| 2008/0142931 A1 | | 6/2008 | Sasaki et al. |
| 2008/0217655 A1 | | 9/2008 | Baumann et al. |
| 2008/0268628 A1 | | 10/2008 | Kohli et al. |
| 2008/0277738 A1 | | 11/2008 | Ananthan |
| 2009/0121268 A1 | | 5/2009 | Lee et al. |
| 2009/0184392 A1 | * | 7/2009 | Cheng et al. .......... 257/532 |
| 2009/0256187 A1 | | 10/2009 | Kim |
| 2010/0237423 A1 | | 9/2010 | Yun et al. |
| 2011/0019486 A1 | | 1/2011 | Jang et al. |
| 2011/0106531 A1 | | 5/2011 | Liu et al. |
| 2011/0215391 A1 | | 9/2011 | Takaishi |
| 2011/0215408 A1 | | 9/2011 | Tang et al. |
| 2011/0220994 A1 | | 9/2011 | Parekh et al. |
| 2012/0086103 A1 | * | 4/2012 | Chakravarti et al. .......... 257/532 |
| 2012/0104491 A1 | | 5/2012 | Heineck et al. |
| 2012/0214285 A1 | | 8/2012 | Guha et al. |
| 2012/0256259 A1 | | 10/2012 | Surthi et al. |
| 2012/0299088 A1 | | 11/2012 | Heineck et al. |
| 2013/0168757 A1 | | 7/2013 | Hong |

OTHER PUBLICATIONS

Gras-Marti, Recoil Implantation Yields and Depth Profiles, Phys. Stat. Sol. vol. 76, No. 1, pp. 621-627 (1983).

Oh et al., Characterization of $B_2H_6$ Plasma Doping for Converted p+ Poly-Si Gate, Ion Implantation Technology, 2006 American Institute of Physics, pp. 25-28 (2006).

Qin et al., Comparative Study of Self-Sputtering Effects of Different Boron-Based Low-Energy Doping Techniques, IEEE Transactions on Plasma Science, vol. 37, No. 9, Sep. 2009, pp. 1760-1766.

Rucker et al., Dopant Diffusion in C-Doped Si and SiGe: Physical Model and Experimental Verification, Int'l Electron Devices Meeting, 1999, 345-348.

* cited by examiner

METHODS OF FORMING DOPED ELEMENTS OF SEMICONDUCTOR DEVICE STRUCTURES

FIELD

The present disclosure, in various embodiments, relates generally to semiconductor device design and fabrication. More particularly, this disclosure relates to the fabrication of semiconductor device structures having doped elements, such as buried, doped, conductive elements.

BACKGROUND

Semiconductor devices, such as memory cells, often incorporated within computer systems for storing data, may be fabricated in one or more arrays of individual memory cells. Memory cells may be configured to be written to, read from, or both using digit lines (which may also be known in the art as "bit lines" or "sense lines") and access lines (which may also be known in the art as "word lines"). Digit lines may electrically interconnect memory cells, or conductive elements therein, along columns of an array, while the access lines may electrically interconnect memory cells, or conductive elements therein, along rows of the memory array. Each memory cell of a memory array may be uniquely addressed through a unique combination of a digit line and an access line.

There is a continuing push to decrease the size of memory devices and to simplify the complexity and amount of wiring associated with memory devices so as to increase the density at which such memory devices may be fabricated. Often, working to achieve these goals increases the risk of defects or errors resulting from imprecisions in the device fabrication processes. For example, attempts to increase the density of memory arrays have included orienting the memory cells of the memory arrays vertically, such that source/drain regions of transistors within the memory cells are vertically aligned with one another. In such vertical transistors, digit lines, which may comprise doped regions of semiconductor material, are "buried," i.e., are disposed vertically lower within the semiconductor material than upper regions of the vertical transistor. While the vertical orientation may decrease the footprint of the vertical transistor, providing doping to a buried region of the semiconductor material may present challenges.

Conventional methods of doping the semiconductor material to form buried, doped elements of a vertical transistor include implanting a dopant into an exposed surface of the semiconductor material at a floor exposed by a trench. The implanted dopant is then subjected to a thermal treatment to diffuse the dopant to regions of the semiconductor material at which the dopant is desired. This desired dopant destination is often vertically below a region of the semiconductor material that is to remain undoped.

As the dopant diffuses to the desired destination, the dopant may also diffuse into regions of the semiconductor material where doping is not desired; therefore, achieving a desired dopant concentration at the desired destination may include allowing the dopant to diffuse throughout a broad region of the semiconductor material, even though dopant concentrations may not be needed throughout much of the broad region. Accordingly, a greater amount of dopant may need to be implanted than is eventually diffused to and used at the desired destination. Moreover, to avoid the dopant diffusing through too broad a region of the semiconductor material, the ultimate concentration of dopant at the desired destination may be limited. Additionally, with the conventional implant technique, it may be challenging to supply a consistent amount of dopant to exposed material surfaces at the floors of a plurality of trenches. For example, if neighboring trenches have floors of differing widths due to, for example, imprecisions in trench formation processes, the amount of dopant implanted into the exposed material surface at the floor of one trench may differ from the amount of dopant implanted into the exposed material surface at the floor of another trench. Therefore, the conventional implantation and diffusion doping technique may not consistently dope the material across a plurality of trenches.

DETAILED DESCRIPTION

Figure 1:
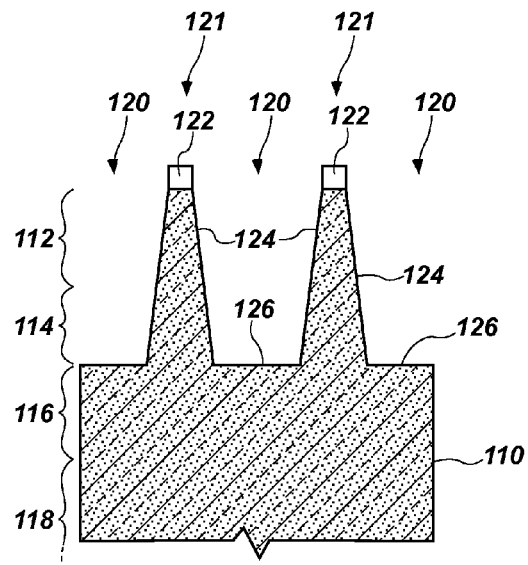
FIGS. 1 through 3 are cross-sectional, elevational, schematic illustrations of a semiconductor device structure during various stages of processing, according to an embodiment of the present disclosure.

Methods of forming doped elements of semiconductor device structures are disclosed. Also disclosed are semiconductor device structures including doped elements. The methods of the present disclosure include providing a dopant by forming a carrier material comprising the dopant on exposed surfaces of a "stem" of a substrate. The stem is located in at least a lower, undercut portion of a trench in the substrate. The dopant is diffused from the carrier material into the stem, converting the stem to a doped element, which may be electrically coupled with conductive material subsequently formed on the doped stem to form a buried digit line of a memory device.

The disclosed methods introduce the dopant proximate to the region of substrate to be doped. Therefore, the methods enable formation of the doped elements (e.g., buried, doped, conductive elements) using a more targeted doping method. The targeted doping may result, in some embodiments, in a higher dopant concentration at the targeted dopant region (e.g., the doped stem), in a dopant diffusion region more centralized to the targeted dopant region (i.e., with less dopant diffusion downward and upward into the material of the substrate), or in both higher dopant concentrations and more centralized dopant diffusion regions compared to dopant diffusion regions achieved with conventional methods. Further, by providing the dopant via the carrier material, the amount of dopant diffused into the stem may be more consistent, from stem to neighboring stem, across an array of semiconductor features, than conventional methods relying upon implantation to provide doping. Therefore, the fabrication methods may be more efficient, effective, and consistent than conventional fabrication methods of forming doped elements.

As used herein, the term "substrate" means and includes a base material or construction upon which components, such as those within memory cells as well as other semiconductor device structures, are formed. Unless otherwise specified, the substrate may be a semiconductor substrate, a base semiconductor material on a supporting structure, or a semiconductor substrate having one or more materials, structures, or regions formed thereon. The substrate may be a conventional silicon substrate or other bulk substrate including a semiconductor material. In some embodiments, for example, the substrate may comprise or consist of monocrystalline silicon. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, the term "vertical" means and includes a direction that is perpendicular to a primary surface of the substrate on or in which the semiconductor device structure is formed.

As used herein, the term "carrier material" means and includes a material, which may be homogeneous or heterogeneous, formulated to accept a dopant. The dopant may be at least partially transferred (e.g., diffused) from the carrier material into a neighboring material during a thermal treatment process. For example, the carrier material may include, but is not limited to, silicon, including monocrystalline silicon, amorphous silicon, and polycrystalline silicon.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular material, feature, structure, region, segment, device, stage, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated but include deviations in shapes that result, for example, from manufacturing. For example, a region illustrated or described as box-shaped may have rough and/or nonlinear features. Moreover, sharp angles that are illustrated may be rounded. Thus, the materials, features, and regions illustrated in the figures are schematic in nature and their shapes are not intended to illustrate the precise shape of a material, feature, region, or structure and do not limit the scope of the present claims.

The following description provides specific details, such as material types and processing conditions, in order to provide a thorough description of embodiments of the disclosed methods and structures. However, a person of ordinary skill in the art will understand that the embodiments of the methods and structures may be practiced without employing these specific details. Indeed, the embodiments of the methods and structures may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, knife coating, dip coating, blanket coating, chemical vapor deposition ("CVD"), atomic layer deposition ("ALD"), plasma enhanced ALD, and physical vapor deposition ("PVD"). Alternatively, the materials may be grown, e.g., by epitaxial growth, in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

With reference to FIGS. 1 through 6, illustrated is a method of forming a doped element of a semiconductor device structure, in which a dopant is provided by forming a carrier material, comprising the dopant, on exposed surfaces of a substrate within trenches separating semiconductor features defined in the substrate. The method may utilize a substrate 110 that may comprise, for example and without limitation, monocrystalline silicon. The substrate 110 may include, for purposes of description, an upper portion 112, a middle portion 114, a lower portion 116, and a base portion 118 along a height of the substrate 110 from top to bottom, respectively. It should be noted that, though FIG. 1 illustrates that each of the upper portion 112, the middle portion 114, the lower portion 116, and base portion 118 are of approximately equal vertical dimensions (e.g., equal height), in other embodiments, the portions need not be approximately equal in height. Moreover, the base portion 118 of the substrate 110 illustrated in the figures extend downward past the lowest point illustrated in the figures.

Initial trenches 120 may be formed in the substrate 110. The initial trenches 120 separate initial semiconductor features 121 comprising the material of the substrate 110. The initial trenches 120 may be formed by, for example, subtractive etching using a previously-patterned mask 122 formed over an upper surface (i.e., the primary surface), of the substrate 110. The mask 122 may include, e.g., a photoresist, hard mask material, or both. In other embodiments, the initial trenches 120 may be formed by additive techniques, e.g., constructing the initial semiconductor features 121 to extend from the lower portion 116 of the substrate 110. In any case, each of the initial trenches 120 exposes and is defined by sidewalls 124 and a floor 126 of the material of the substrate 110. In some embodiments, the sidewalls 124 may be obliquely angled (i.e., disposed at an angle other than 90° from the primary surface of the substrate 110), as illustrated in FIG. 1. However, in other embodiments, the sidewalls 124 may be formed to be substantially vertical (i.e., disposed at an angle of about 90° from the primary surface of the substrate 110). The floor 126, exposed at the bottom of each initial trench 120, may be substantially parallel to the primary surface of the substrate 110. In some embodiments, such as those in which the sidewalls 124 are formed to be substantially vertical, the floor 126 may be substantially perpendicular to the sidewalls 124.

The initial trenches 120, and therefore also the initial semiconductor features 121, may be formed to be disposed in what is referred to herein as the upper portion 112 and the middle portion 114 of the substrate 110. In embodiments in which the disclosed methods are used to form memory cells, the upper portion 112 may eventually include an upper source/drain region of a vertical transistor, and the middle portion 114 may eventually include a channel region of the vertical transistor. In some embodiments, the upper portion 112 and the middle portion 114 may, optionally, be doped with one or more conductivity-type dopants at desired finished circuitry concentrations at this stage in the method. In other embodiments, the substrate 110, including the upper portion 112 and the middle portion 114 may be free of dopants, entirely or substantially, at this stage in the method.

Figure 2:
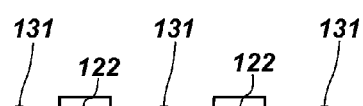

With reference to FIG. 2, a masking material 130 may be formed (e.g., conformally formed, deposited) over at least some surfaces exposed within the initial trenches 120, such as all surfaces of the initial semiconductor features 121, including the sidewalls 124 and the floors 126. The exterior surfaces of the mask 122 may also be covered with the masking material 130. Resulting trenches 131 may, therefore, be defined by an exposed surface of the masking material 130.

The masking material 130 may or may not be sacrificial, may be homogeneous or heterogeneous, and may be conductive, semiconductive, or dielectric. For example, without limitation, the masking material 130 may include or consist of an oxide, a nitride, or both (i.e., a nitride overlying an oxide). The masking material 130 may be formed to a thickness of about 2 nm to about 15 nm (e.g., about 8 nm to about 10 nm) and may be formulated and configured to prevent unwanted removal, unwanted doping, or both of underlying material of the substrate 110 during subsequent stages of the fabrication process.

Figure 3:
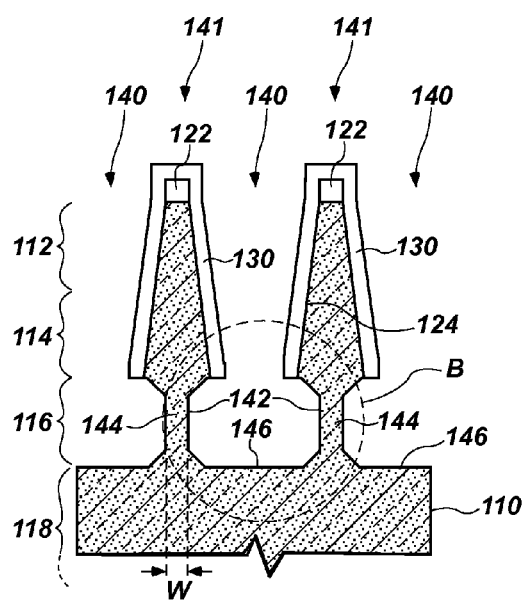

The trenches 131 may be extended, as illustrated in FIG. 3, into the substrate 110, for example, into the lower portion 116 of the substrate 110, to form extended trenches 140, spaced by extended semiconductor features 141. Each extended trench 140 includes a lower, undercut portion defined by recessed sidewalls 142. Each recessed sidewall 142 may be spaced from an opposing recessed sidewall 142 by a stem 144 of the material of the substrate 110. The extended trenches 140 are also defined by floors 146 exposed at the bottom of the extended trenches 140. Each floor 146 extends from one recessed sidewall 142 exposed in a lower, undercut portion of the extended trench 140 to another recessed sidewall 142 exposed in the lower, undercut portion. The floors 146 include a surface of the substrate 110, e.g., a surface of the base portion 118 of the substrate 110.

Figure 3B:
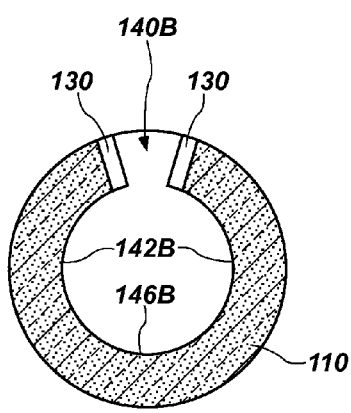
FIG. 3B is an enlarged view of area B of FIG. 3, wherein an undercut portion of an extended trench is defined by substantially round sidewalls and a round floor.

With reference to FIG. 3B, illustrated is an alternate structure of the undercut portion of extended trenches 140B. As illustrated, the undercut portion of the extended trenches 140B may, alternatively, be formed to be defined by rounded recessed sidewalls 142B and rounded floors 146B, such that the undercut portion of the extended trenches 140B may be defined by a substantially round shape. Therefore, the rounded recessed sidewalls 142B and rounded floors 146B may not be distinctly defined apart from one another. In other embodiments, the undercut portions of the extended trenches 140B may be defined to have recessed sidewalls of a shape other than that illustrated in FIGS. 3 and 3B. Methods of forming trenches, such as extended trenches 140 (FIG. 3) and 140B (FIG. 3B) with undercut portions having other vertical cross-sectional shapes are known in the art and are described, for example, in U.S. Pat. No. 7,709,341.

The extended trenches 140 may be formed by, for example, removing a base portion 132 (FIG. 2) of the masking material 130, i.e., the portion of the masking material 130 that covered the floor 126 exposed in the initial trenches 120 (FIG. 1). The base portions 132 of the masking material 130 may be removed, for example and without limitation, by masked or mask-less anisotropic etching of the masking material 130. As illustrated in FIG. 3, remaining portions of the masking material 130 may remain over the sidewalls 124 of the initial semiconductor features 121 (FIG. 1) that were exposed in the initial trenches 120 (FIG. 1) and over the mask 122. These remaining portions of the masking material 130 may thereafter discourage etching of covered portions of the substrate 110. As discussed in more detail below, before the extended trenches 140 are formed, one or more dopants may, optionally, be introduced (e.g., implanted) to the exposed material of the substrate 110, e.g., to the floors 126, before or following the selective removal of the base portion 132 of the masking material 130. However, according to the embodiment illustrated in FIGS. 1 through 6, the extended trenches 140 are formed before the substrate 110 is doped.

The extended trenches 140 may be formed by removing material of the substrate 110 from the lower portion 116 of the substrate, for example, by etching deeper into the substrate 110. Methods of forming trenches, such as extended trenches 140, with undercut portions are known in the art and are described, for example, in U.S. Pat. No. 7,709,341. As illustrated in FIG. 3, the etching may remove portions of the substrate 110 both vertically below the floor 126 (FIG. 1) exposed by the initial trench 120 (FIG. 1) and laterally under the initial semiconductor features 121 (FIG. 1). Thus the lower, undercut portion of each extended trench 140 is broader (e.g., wider) between the stems 144 of the substrate 110 material than the portion of the extended trench 140 occupying what was the floor 126 exposed by the initial trench 120.

The extended semiconductor features 141, separating and defining the extended trenches 140, each include the stem 144 of the substrate 110 material disposed between lower, undercut portions of neighboring extended trenches 140. Each stem 144 extends between the base portion 118 of the substrate 110 and an overlying, broader portion of the substrate 110. For example, as illustrated in FIG. 3, each stem 144 may be overlain by a broad segment of the middle portion 114 of the substrate 110. Accordingly, the stems 144 may be buried relative to the upper portion 112 and the middle portion 114 of the substrate 110.

Though the extended semiconductor features 141 may be formed, as illustrated in FIGS. 1 through 3, by subtractive etching of the substrate 110, e.g., by wet or dry etching, it is contemplated that the extended semiconductor features 141 may, alternatively, be formed by additive techniques, e.g., first, fabricating the stems 144 extending from the floors 146 at the base portion 118 of the substrate 110 and, second, fabricating over the stems 144 the middle portions 114 and upper portions 112 of the substrate 110. In such embodiments, the stages of FIGS. 1 and 2 may be by-passed.

The lower, undercut portion of the extended trenches 140 may be formed to such a width that the stems 144 therebetween will have a smallest stem width W achievable without substantial risk of mechanical collapse of the extended semiconductor features 141. For example, the lower, undercut portion of the extended trenches 140 may be formed such that the stem width W is less than about 20 nm (e.g., about 10 nm to about 12 nm, where the material of the substrate 110 is monocrystalline silicon).

Figure 4:
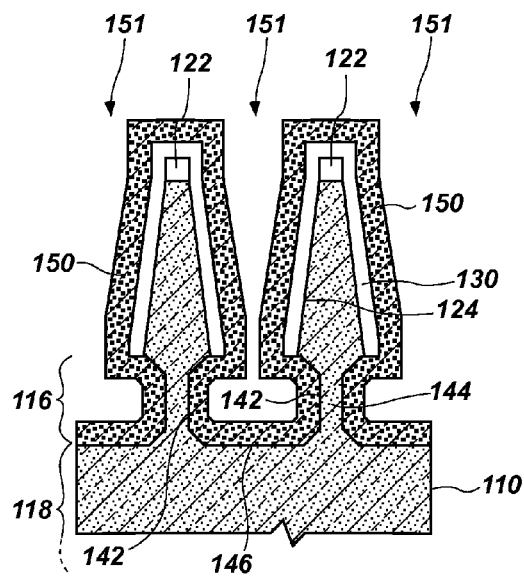
FIGS. 4 through 6 are cross-sectional, elevational, schematic illustrations of a semiconductor device structure during various stages of processing subsequent to those illustrated in FIGS. 1 through 3, according to an embodiment of the present disclosure in which a carrier material, comprising a dopant, is formed over exposed surfaces of the semiconductor device structure of FIG. 3, the resulting semiconductor device structure including a doped element.

With reference to FIG. 4, a carrier material 150 may be formed on exposed surfaces within the extended trenches 140 (FIG. 3). The carrier material 150 may include or consist of silicon (e.g., amorphous silicon, polycrystalline silicon, or monocrystalline silicon) and a dopant. The dopant may include, for example and without limitation, an n-type dopant (e.g., phosphorus, arsenic, or another known n-type dopant) or a p-type dopant (e.g., boron or another known p-type dopant). The dopant used may be selected to tailor the doped element to be formed according to the needs of the semiconductor device structure in which the doped element is to be incorporated. For example, the dopant in the carrier material 150 may be tailored to convert the stems 144 in the lower portion 116 of the substrate 110 to a conductive region of the substrate 110 so as to enable electric coupling of conductive material (e.g., conductive material 178 (FIG. 6B)) later formed on the stems 144, e.g., for forming buried digit lines of a memory cell.

The carrier material 150 may be saturated with the dopant, which may be referred to herein as "saturation doped." Saturation doping levels may include, for example and without limitation, up to about $1 \times 10^{21}$ atoms of dopant per cubic centimeter of the carrier material 150 (i.e., $1 \times 10^{21}$ atoms/cm$^3$) to about $5 \times 10^{21}$ atoms of dopant per cubic centimeter of the carrier material 150 (i.e., $5 \times 10^{21}$ atoms/cm$^3$). In other embodiments, the carrier material 150 may have a concentration of the dopant that is less than its maximum possible concentration.

The carrier material 150 may optionally include, in addition to the dopant, components formulated to reduce or prevent outgassing of the dopant or rampant diffusion of the dopant during subsequent processing stages. For example, the carrier material 150 may include components such as carbon, nitrogen, or both.

The carrier material 150 may be formed on at least the sidewalls 142 of the stems 144 exposed in the lower, undercut portion of the extended trenches 140 (FIG. 3). The carrier material 150 may, optionally, also be formed on some of or all of other exposed surfaces within the extended trenches 140 (FIG. 3). Resulting trenches 151 may, therefore, be defined by exposed surfaces of the carrier material 150.

The carrier material 150 may be formed by, for example, ALD, CVD, or another known formation method. In embodiments utilizing ALD, the carrier material 150 may be formed using multiple precursor materials and multiple sequences of introducing the precursor materials to the structure on which the carrier material 150 is formed.

In some embodiments, the carrier material 150 may be formed to have a uniform thickness (e.g., of about 5 nm) and a uniform density over the exposed surfaces within the extended trenches 140 (FIG. 3), presenting a continuous exterior surface. However, in other embodiments, the carrier material 150 may be discontinuous (e.g., may include pinholes). The presence of pinholes may not prevent the carrier material 150 from providing the dopant to the surfaces of the substrate 110 on which the carrier material 150 is formed.

The carrier material 150 may be formed in one or more stages, e.g., in one or more material formations. For example, the carrier material 150 may be formed to its total thickness in one material formation stage. In other embodiments, the carrier material 150 may be formed to its total thickness in multiple material formation stages. In embodiments in which the carrier material 150 is formed in multiple stages, each stage may utilize the same concentration of the dopant and, if present, other components in the carrier material 150, or, different concentrations. For example, the carrier material 150 may be formed by first forming, over the sidewalls 142, an amount of the carrier material 150 that is doped to saturation with the dopant and then forming, over the saturation-doped amount, another amount of the carrier material 150 that has a lower concentration of the dopant (e.g., no concentration of dopant) and, optionally, a higher concentration of outgassing-preventing components. Later-formed amounts of carrier material 150 may, therefore, be configured to discourage outgassing of the dopant during subsequent stages of the method.

In some embodiments, such as that illustrated in FIG. 4, the carrier material 150 may be formed to partially fill the lower, undercut portion of the extended trenches 140 (FIG. 3). However, in other embodiments, the carrier material 150 may be formed to completely fill or overfill the lower, undercut portion of extended trenches 140. For example, the greater the amount of dopant that is desired to be transferred to the stems 144 or segments of the substrate 110 material proximate thereto, the more carrier material 150 fill may be desired in the lower, undercut portions of the extended trenches 140.

Because the carrier material 150 is formed at least on the sidewalls 142 exposed in the lower, undercut portion of the extended trenches 140 (FIG. 3), the center of each stem 144 (which may be undoped at this stage in the process) may be spaced from the doped carrier material 150 by only half the stem width W. Therefore, half the stem width W (e.g., about 5 nm to about 6 nm) may represent the diffusion length, i.e., the maximum distance the dopant must diffuse from the carrier material 150 to dope the center of the stem 144. The diffusion length (half of the stem width W) according to the disclosed methods may be substantially smaller than (e.g., less than about half the length of) the diffusion length of conventional methods (i.e., the distance between a dopant implantation site and a desired dopant destination).

Figure 5:
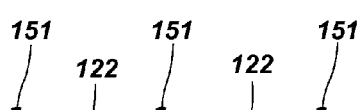

As illustrated in FIG. 5, dopant from the carrier material 150 may be diffused into the neighboring surfaces of the material of the substrate 110, i.e., into the sidewalls 142, the floor 146, and eventually into the body of the stems 144. The dopant from the carrier material 150 may be diffused by use of thermal treatment. Subjecting the structure of FIG. 4, or at least the carrier material 150 proximate to the stems 144, to heat may encourage the dopant from the carrier material 150 to diffuse into neighboring material of the substrate 110, for example, into the monocrystalline silicon. During the thermal treatment stage, the semiconductor structure may be exposed to an oxidative environment, such as an oxygen environment, to discourage outgassing of the dopants. The oxidative environment may also enhance the diffusion of the dopant, e.g., by oxidation enhanced diffusion.

For at least so long as the structure is subjected to the heat, the dopant may continue to diffuse away from the carrier material 150, e.g., upward into the middle portion 114 of the substrate 110 and downward into the base portion 118 of the substrate 110, such that a resulting dopant diffusion region 152 may include not only the lower portion 116 of the substrate 110, but also segments or all of the middle portion 114 and the base portion 118 of the substrate 110.

The concentration of the diffused dopant from the carrier material 150 may intentionally be concentrated at the stem 144. Because the diffusion length (i.e., the distance separating the center of the stem 144 to the nearest carrier material 150 with dopant) is shorter than the corresponding diffusion length of conventional methods, diffusing the dopant from the carrier material 150 through the body of the stem 144 may result in a more targeted (e.g., less spread) dopant diffusion region 152 than diffusion regions achieved with conventional implantation-and-diffusion methods. In some embodiments, the desired dopant concentration in the stem 144 may be achieved with a shorter thermal treatment time, also referred to herein as a shorter "drive time," than that required to diffuse dopants to desired dopant destinations in conventional implantation-then-diffusion methods. For example, the drive time utilized for diffusing the dopant from the carrier material 150 through the body of the stem 144 may be achieved in about 15 minutes to about 30 minutes at a temperature of around 900° C. The drive time chosen may be tailored in consideration of the temperature utilized during the thermal treatment, e.g., a longer drive time may be used for a lesser temperature, and vice versa.

Introducing the dopant by forming the carrier material 150 on the sidewalls 142 proximate to the stem 144 may enable the dopant delivery to be more targeted to the lower portion 116 of the substrate 110 and to the stem 144 therein than a diffusion region following a thermal treatment of a conventional method. Accordingly, the resulting doped stems 144 may achieve a higher dopant concentration, for a particular initial amount of dopant supplied to the process, than corresponding regions of a substrate following a conventional dopant implantation-and-diffusion process using the same initial amount of dopant.

Diffusing the dopant into the stems 144 may, depending on the dopant used, convert the stems 144 from semiconductive to conductive. The conductive, doped stems 144 (e.g., in FIG. 5) may, therefore, have a lower overall resistance compared to the semiconductive, undoped stems 144 (e.g., in FIG. 3). Accordingly, the buried, conductive, doped stems 144 may be configured to be incorporated with digit lines of a memory cell.

It is contemplated that some dopant from the carrier material 150 may diffuse into some of the masking material 130 on the semiconductor device structure during the thermal treatment. Nonetheless, the presence of dopant in the masking material 130 may not negatively impact the remainder of the fabrication process or the resulting semiconductor device structure.

The focused targeting of the dopant in the stem 144 also enables use of more efficient techniques for isolating neighboring doped stems 144 to form, e.g., buried, doped, conductive elements for digit lines. That is, because the targeted dopant delivery may result in a more targeted dopant diffusion region 152 (i.e., the dopant diffusion region 152 with less spreading), the dopant diffusion may remain centralized to the stems 144 and may not penetrate substantially deep into the base portion 118 of the substrate 110 or upward into the middle portion 114 of the substrate 110. Accordingly, less of the material of the substrate 110, in the base portion 118, may need to be removed to isolate one segment of dopant diffusion region 152 from another segment (e.g., to electrically isolate one digit line to be formed from a neighboring digit line to be formed). Moreover, because both the downward diffusion and the upward diffusion may be less than that of conventional methods and structures, the actual electrical device length (the "L-effective" or "L-eff") of the resulting semiconductor device structure including the doped element may be relatively short, compared to conventional methods and structures. The short L-eff may enhance scalability of the resulting semiconductor device.

Figure 6:
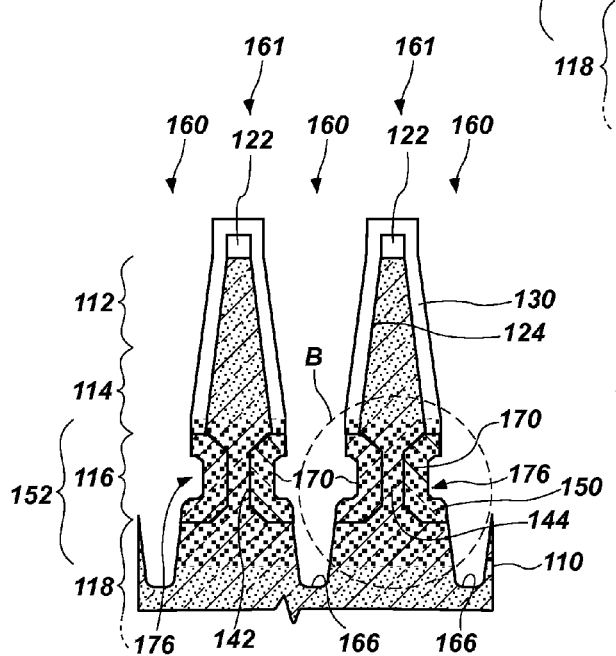

With reference to FIG. 6, neighboring doped stems 144 may be isolated from one another by further extending the depth of the trenches 151 (FIG. 5) to form separation trenches 160 that extend through the dopant diffusion regions 152 to expose, at floors 166, regions in the base portion 118 of the substrate 110 that are either entirely undoped or less doped to the extent that the exposed regions at floors 166 are not conductive. That is, in some embodiments, the exposed region at floors 166 may comprise dopant, but at a lower concentration than the dopant in the dopant diffusion region 152, provided the material exposed at the floors 166 has a low enough dopant concentration to effectively electrically isolate the dopant diffusion region 152 of one doped feature 161 from its neighboring doped feature 161. Such a low dopant concentration is referred to herein as being "substantially free" of dopant. Notably, because the carrier material 150 may be formed directly on the stems 144 with a more precise targeting of the dopant and with less dopant spread during diffusion, the dopant may not diffuse as deeply into the substrate 110 as it would according to conventional processes. Accordingly, isolating neighboring doped stems 144 may include formation of separation trenches 160 that do not extend as deep into the substrate 110 (or, rather, not as deep, relative to the floors 146 exposed by the extended trenches 140 (FIG. 3)) as separation trenches formed by conventional processes.

The separation trenches 160 may be formed utilizing the same subtractive etching techniques utilized to form the initial trenches 120 (FIG. 1) or other known removal techniques. During formation of the separation trenches 160, segments of doped material of the substrate 110 are removed. For example, segments of the carrier material 150 formed over the floor 146 exposed by each extended trench 140 (FIG. 3) may be removed. These segments may still include some concentration of dopant, even after the thermal treatment. Additionally, segments of the substrate 110 into which dopant has diffused (e.g., portions of the substrate 110 disposed proximate to the floors 146 (FIG. 5)) may be removed to form the separation trenches 160.

Following formation of the separation trenches 160, segments 170 of the carrier material 150 may remain. The remaining segments 170 may be recessed within the sidewalls 142 previously exposed in the lower, undercut portions of the extended trenches 140 (FIG. 3). The upper regions of the carrier material 150 may have been removed during or subsequent to formation of the separation trenches. The remaining segments 170 of the carrier material 150, may, optionally, be subsequently removed before fabrication of the semiconductor device structure is completed.

As illustrated in FIG. 6, after formation of the separation trenches 160, dopant from the carrier material 150 may remain dispersed throughout the lower portion 116 of the substrate 110, including the stem 144. Each doped region of the formed, doped features 161 (including, e.g., doped monocrystalline silicon material from the substrate 110 and doped amorphous silicon or doped polycrystalline silicon material from the carrier material 150) may be isolated (e.g., physically and electrically isolated) from a neighboring doped region of a neighboring doped feature 161 by the separation trench 160. Therefore, one remaining segment 170 of the remaining carrier material 150 may be laterally spaced from an opposing remaining segment 170 of the remaining carrier material 150 by one of the stems 144 and may be laterally spaced from another remaining segment 170 of the remaining carrier material 150 by one of the separation trenches 160.

In some embodiments in which the carrier material 150 comprises doped amorphous silicon, the amorphous silicon of the carrier material 150 may be converted to polycrystalline silicon during exposure of the carrier material 150 to heat, e.g., during subsequent fabrication stages. Accordingly, it is contemplated that an amorphous silicon carrier material 150 may be used and ultimately result in the remaining segments 170 comprising polycrystalline silicon (e.g., doped polycrystalline silicon).

Figure 6B:
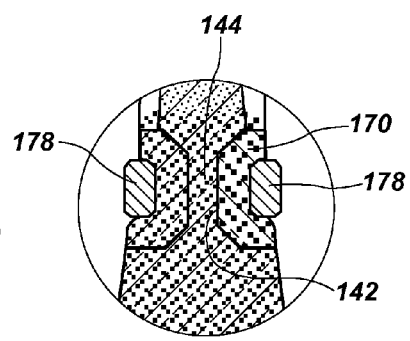
FIG. 6B is an enlarged view of area B of FIG. 6, wherein the semiconductor device structure with doped element of FIG. 6 further includes conductive material received in recessed sidewalls of a doped portion of a semiconductor feature.

With reference to FIG. 6B, following fabrication of the semiconductor device structure of FIG. 6, conductive material 178 may be deposited within recesses 176 defined in the exterior surfaces of the remaining segments 170 of the carrier material 150. The neighboring doped stems 144, which may be conductive due to the doping, may be configured to electrically couple the conductive material 178 deposited within the recesses 176 on opposing sides of the doped stems 144. Accordingly, digit lines comprising the conductive material 178 may be formed proximate to the doped stems 144. Methods for depositing the conductive material 178 and subsequent stages of the process for completing the fabrication of, for example, digit lines for a memory array are known in the art and are described, for example, in U.S. Patent Publication No. 2012/0214285 A1. The conductive material 178 may include, for example and without limitation, elemental metals, alloys of elemental metals, conductive metal compounds, conductively-doped semiconductive material, or any combination thereof. In some embodiments, the conductive material 178 includes or consists of titanium nitride.

Accordingly, disclosed is a method of forming a doped element of a semiconductor device structure. The method comprises forming trenches in a semiconductor substrate. Each of the trenches comprises a lower, undercut portion defined by laterally recessed sidewalls of the semiconductor substrate. A carrier material comprising a dopant is formed on the laterally recessed sidewalls. The dopant is diffused from the carrier material into the laterally recessed sidewalls of the semiconductor substrate.

Figure 7:
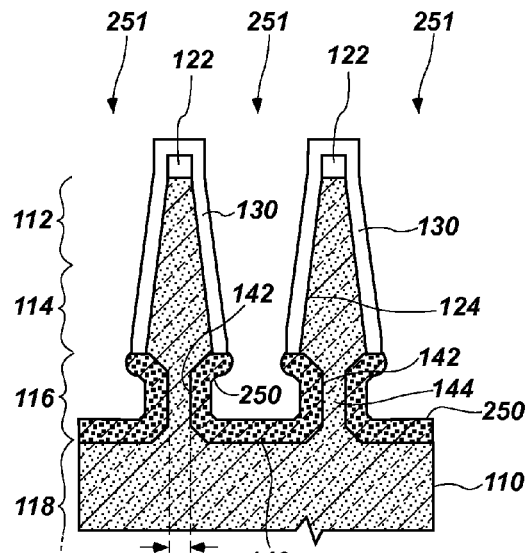
FIGS. 7 through 9 are cross-sectional, elevational, schematic illustrations of a semiconductor device structure during various stages of processing, according to an embodiment of the present disclosure in which a carrier material, comprising a dopant, is formed over lower exposed surfaces of the semiconductor device structure of FIG. 3, the resulting semiconductor device structure including a doped element.
Figure 8:
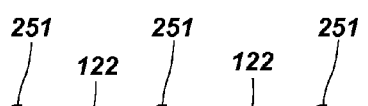
Figure 8:
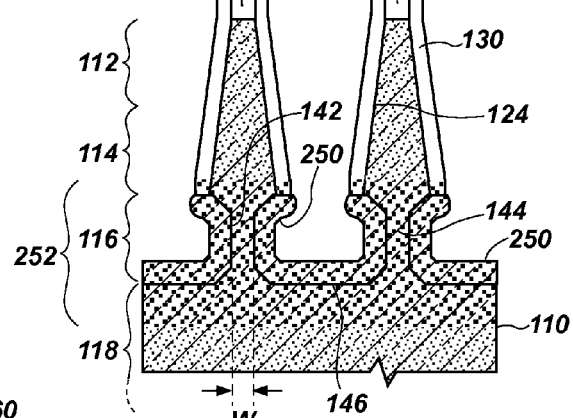
Figure 9:
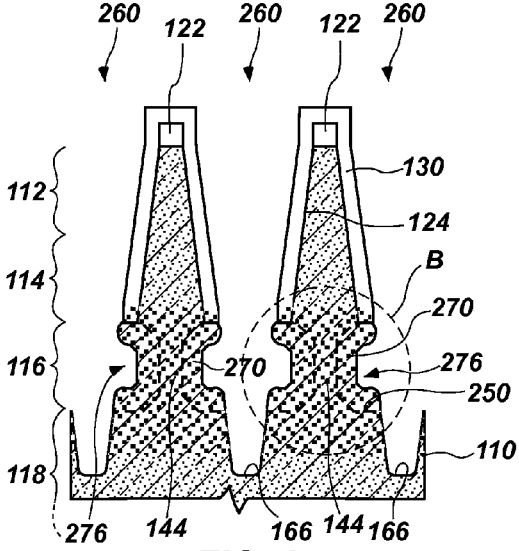

With reference to FIGS. 7 through 9, illustrated is an alternative method for forming a doped element of a semiconductor device structure in which a dopant is provided by an epitaxially grown carrier material. The fabrication stage illustrated in FIG. 7 follows that illustrated in FIG. 3 and described above. However, rather than forming the carrier material 150 (FIG. 4) on all exposed surfaces of the semiconductor features 141 as illustrated in FIG. 4, a carrier material 250 comprising the dopant is epitaxially grown on only the surfaces (e.g., the sidewalls 142 and the floor 146) exposed within the lower, undercut portions of the extended trenches 140 (FIG. 3).

The carrier material 250 may be selectively epitaxially grown on the surfaces of the material of the substrate 110 exposed in the lower, undercut portion of the extended trenches 140. However, in other embodiments, the carrier material 250 may be also formed on the exposed surfaces of, for example, the masking material 130. In any case, the resulting formed trenches 251 are defined by the carrier material 250 within the lower, undercut portion of the extended trenches 140 (FIG. 3).

The carrier material 250 may include silicon and may be saturation doped with the dopant. In some embodiments, the carrier material 250 may include monocrystalline silicon, and the substrate 110 may also include monocrystalline silicon. That is, the carrier material 250 may be grown on the surfaces exposed in the lower, undercut portion of the extended trench 140 with essentially the same crystalline structure as monocrystalline silicon material of the substrate 110.

The carrier material 250 may be formed to partially fill, completely fill, or over fill the lower, undercut portion of the extended trench 140 (FIG. 3). Whether or not the carrier material 250 is formed to partially fill, fully fill, or overfill the undercut portion may depend on the amount of dopant desired to be provided to the lower portion 116 of the substrate 110, including the stem 144. For example, where a higher concentration of dopant in the stem 144 is desired, a greater amount of the carrier material 250 may be formed in the undercut portion of the extended trench 140.

The semiconductor device structure of FIG. 7 may then be exposed to a thermal treatment to diffuse the dopant from the carrier material 250 into at least the stem 144 as well as, for example, into segments of the base portion 118 of the substrate 110, forming a dopant diffusion region 252 (FIG. 8) that includes at least the stems 144. In embodiments in which the carrier material 250 is formed as monocrystalline silicon having the same crystalline structure as monocrystalline silicon of the substrate 110, there may be no visual distinction, such as when viewed microscopically, between the material of the carrier material 250 and the material of the stem 144 following the thermal treatment and diffusion of the dopant into the stem 144.

With reference to FIG. 9, the doped stems 144 may then be isolated from one another by extending the depth of the trenches 251 to form separation trenches 260 exposing an updoped segment (i.e., a segment entirely or substantially free of dopant) of the base portion 118 of the substrate at the floor 166 of each separation trench 260. Segments 270 of the carrier material 250 may remain after formation of the separation trenches 260. The remaining segments 270 may consist of or comprise segments recessed within the sidewalls 142 (FIG. 8) of the stems 144. Again, the remaining segments 270 of the carrier material 250 may be visually indistinguishable from the neighboring material of the substrate 110 fainting the stem 144.

Figure 9B:
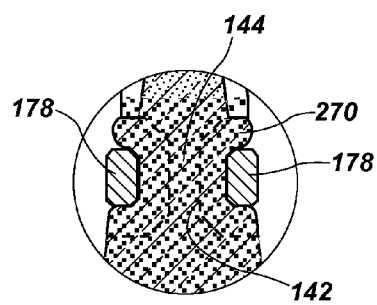
FIG. 9B is an enlarged view of area B of FIG. 9, wherein the semiconductor device structure of FIG. 9 further includes conductive material received in recessed sidewalls of a doped portion of a semiconductor feature.

In embodiments in which the carrier material 250 was formed without filling the undercut portion of the extended trenches 140 (FIG. 3), the remaining segments 270 of the carrier material 250 may define, therein, recesses 276. Again, conductive material 178 may be deposited in the recesses 276, as illustrated in FIG. 9B, and the fabrication process carried forward to form completed semiconductor device structures, including buried, doped, conductive elements (e.g., digit lines) of, for example, memory cells or memory arrays, as discussed above.

Accordingly, disclosed is a method of forming a doped element of a semiconductor device structure. The method comprises forming a plurality of semiconductor features each comprising a stem between a base portion and an overlying broader portion. A carrier material comprising a dopant is formed on sidewalls of each stem of the plurality of semiconductor features. The dopant is diffused from the carrier material into each stem of the plurality of semiconductor features to form a plurality of doped stems.

Figure 10:
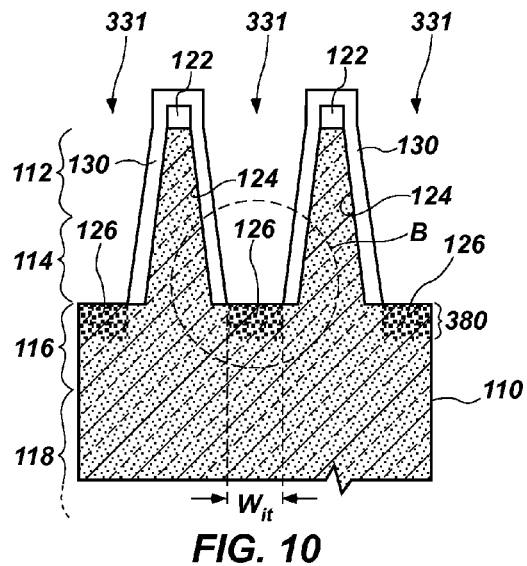
FIG. 10 is a cross-sectional, elevational, schematic illustration of a semiconductor device structure during a stage of processing, according to an embodiment of the present disclosure in which a dopant is implanted into an exposed surface of the substrate following the stage illustrated in FIG. 2 and prior to the stage illustrated in FIG. 3.
Figure 10B:
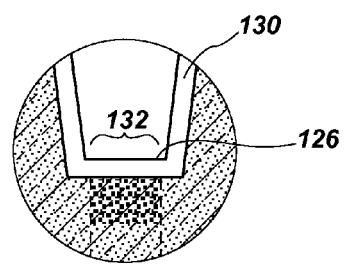
FIG. 10B is an enlarged view of area B of FIG. 10 in an alternate embodiment in which a dopant is implanted into a covered surface of the substrate following the stage illustrated in FIG. 2 and prior to the stage illustrated in FIG. 3.
Figure 11:
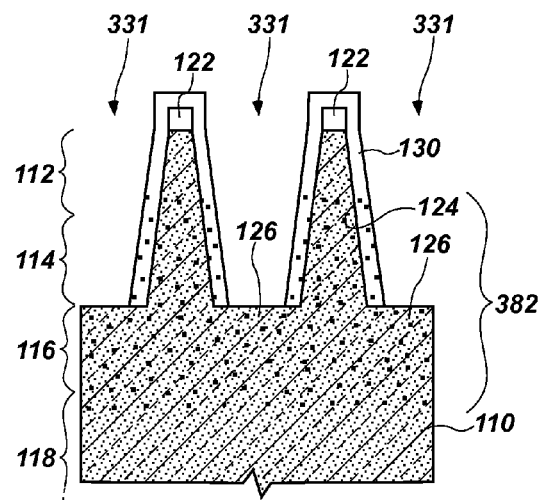
FIGS. 11 and 12 are cross-sectional, elevational, schematic illustrations of a semiconductor device structure during various stages of processing subsequent to the stage illustrated in FIG. 10, according to an embodiment of the present disclosure, the resulting semiconductor device structure including a dopant gradient.
Figure 12:
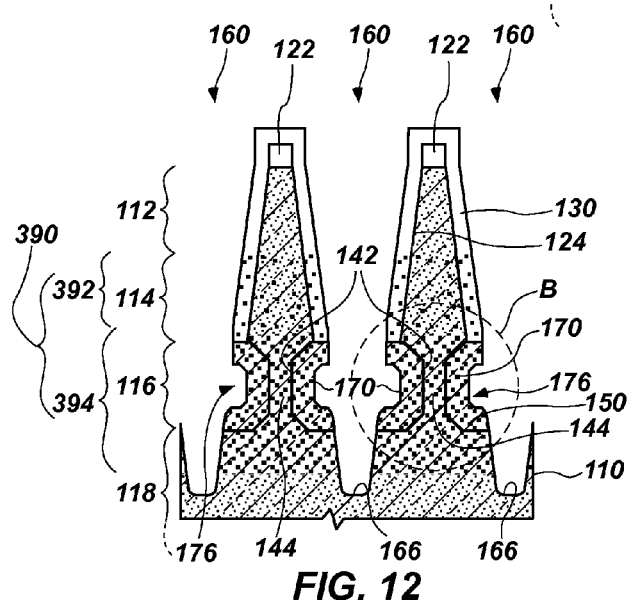

With reference to FIGS. 10 through 12, the embodiments discussed above may, optionally, be combined with stages for providing a dopant to segments of the substrate 110 prior to formation of the carrier material 150 or 250. The resulting doped element may, therefore, include a dopant gradient. For example, as illustrated in FIG. 10, following removal of the base portion 132 (FIG. 2) of the masking material 130, a dopant, which may be the same or different than the dopants discussed above, may be implanted into an exposed surface of the substrate 110, for example, the floor 126 exposed by trenches 331. Techniques for implanting dopants into such exposed surfaces are known in the art and are described, for example, in the aforementioned U.S. Patent Publication No. 2012/0214285. Alternatively, as illustrated in FIG. 10B, dopant may be implanted into the floor 126 without first removing the base portion 132 of the masking material 130 such that the floor 126 may be covered when the dopant is implanted.

Notably, implanting the dopant into the floor 126 forms an implanted dopant region 380 concentrated at the floor 126. The amount of dopant implanted into the floor 126 may depend, at least in part, on the available surface of the floor 126, for example, on the width $W_{fl}$ of the floor 126 exposed by the trench 331 (in FIG. 10) or overlain by the base portion 132 of the masking material 130 (in FIG. 10B). That is, a broad floor 126 may be implanted with a greater amount of the dopant than a neighboring, narrower floor 126.

With further regard to FIG. 10, following the dopant implantation, the dopant from the implanted dopant region 380 may thereafter be subjected to a thermal treatment to diffuse the dopant from the implanted dopant region 380 throughout a dopant diffusion region 382, as illustrated in FIG. 11. The dopant diffusion region 382 may include, for example, the middle portion 114 and the lower portion 116 of the substrate 110. To accomplish the diffusion of the dopant from the localized implanted dopant region 380 to the distant middle portion 114 and lower portion 116 of the substrate 110, the thermal treatment may be carried out for a longer period of time, i.e., for a longer drive time, than the above-described thermal treatment times for diffusing dopant from the carrier material 150 (FIG. 4) or 250 (FIG. 7) into the stems 144.

Though FIG. 10 illustrates that the trenches 331 are of approximately the same dimensions as trenches 131 (FIG. 2) described above, it is contemplated that the trenches 331 may be of a shallower depth than the trenches 131 previously described. In any case, the dimensions, including the depth, of the trenches 331 and any of the above-described trenches (e.g., initial trenches 120, extended trenches 140, separation trenches 160, and separation trenches 260) and below-described trenches may be tailored to meet the design limitations of the semiconductor device structures to be formed. For example, a semiconductor device requiring doping at a greater depth into a substrate may be formed with a method that forms the initial trenches 120 or the extended trenches 140 to a lower elevation in the substrate 110 than formed by other embodiments according to the present disclosure.

Following thermal treatment to form the dopant diffusion region 382, the depth of the trenches 331 may be extended to form lower, undercut portions; a carrier material may be formed on exposed surfaces within at least the undercut portions; dopant from the carrier material may be diffused into stems between the undercut portions; and the then-doped stems may be isolated from one another by formation of separation trenches, as described above with respect to the embodiments of FIGS. 3 through 9. Accordingly, the resulting semiconductor device structure of FIG. 12 may include a semiconductor feature having a gradient diffusion region 390. The gradient diffusion region 390 may include, for example, a low-doped region 392 and a heavily-doped region 394. The low-doped region 392 may be disposed in the middle portion 114 of substrate 110 and may have been formed from the implanted dopant, i.e., from the dopant diffusion region 382 (FIG. 11). The heavily-doped region 394 may be disposed in the lower portion 116 of the substrate 110 and may have been formed from the carried dopant, i.e., from the dopant diffusion region 152 (FIG. 6) or 252 (FIG. 8).

It is contemplated that additional doping stages, either dopant implanting stages (e.g., FIGS. 10 and 11) or carried dopant diffusion stages (e.g., FIGS. 4 through 9) may be repeated to tailor the amount of doping and distribution of doping in the resulting semiconductor device structure. For example, with reference to FIG. 12, additional dopant may be implanted into the floor 166 exposed at the bottom of the separation trenches 160, in the same manner as the dopant implanted according to the stage illustrated in either of FIGS. 10 and 10B. Alternatively or additionally, the depth of the separation trench 160 may be extended with an additional undercut trench portion in which additional carrier material (e.g., carrier material 150 or 250) may be formed and from which additional dopant may be diffused into a lower stem portion to provide additional doping below the gradient diffusion region 390 illustrated in FIG. 12.

Figure 12B:
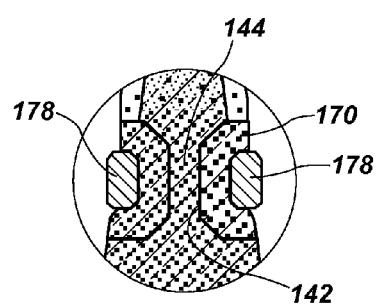
FIG. 12B is an enlarged view of area B of FIG. 12, wherein the semiconductor device structure of FIG. 12 further includes conductive material received in recessed sidewalls of a doped portion of a semiconductor feature.

In any case, the resulting semiconductor device structure includes the stem 144 and, distributed therethrough, dopant received from a carrier material (e.g., carrier material 150 or 250). The doped stem 144 extends between the base portion 118 of the substrate 110 and an overlying broader portion of the material of the substrate 110, e.g., the middle portion 114 of the substrate 110. Each doped stem 144 is isolated from a neighboring doped stem 144 by a separation trench (e.g., separation trench 160 or 260). At least in embodiments in which the dopant diffused into the stem 144 originated from an amorphous silicon carrier material (e.g., carrier material 150), the resulting semiconductor device structure also includes segments of amorphous or polycrystalline silicon, also including the dopant, recessed in the sidewalls 142 of the material of the substrate 110 (e.g., monocrystalline silicon). Again, conductive material 178 may be deposited in recesses 176 defined in remaining segments 170 of the carrier material 150, as illustrated in FIG. 12B.

Accordingly, disclosed is a semiconductor device structure comprising a semiconductor feature extending from a base portion of a substrate. The semiconductor feature comprises monocrystalline silicon and a dopant. The semiconductor device structure also comprises segments of amorphous silicon or polycrystalline silicon recessed in sidewalls of the semiconductor feature. The segments of amorphous silicon or polycrystalline silicon comprise the dopant.

Figure 13:
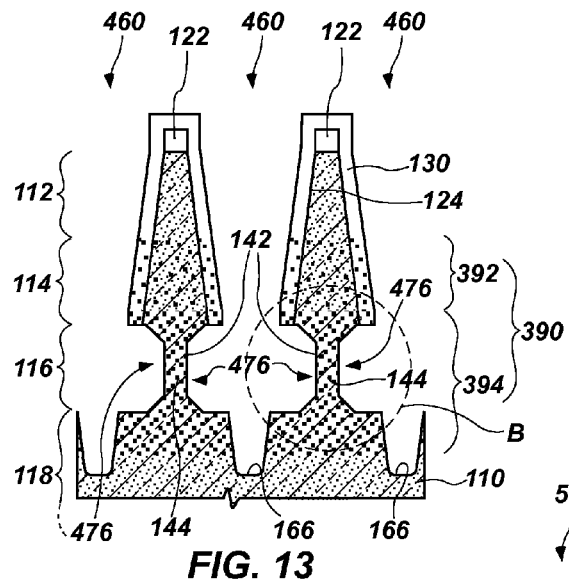
FIG. 13 is a cross-sectional, elevational, schematic illustration of a semiconductor device structure during a stage of processing subsequent to the stage illustrated in FIG. 12, according to an embodiment of the present disclosure, the resulting semiconductor device structure including a dopant gradient.
Figure 13B:
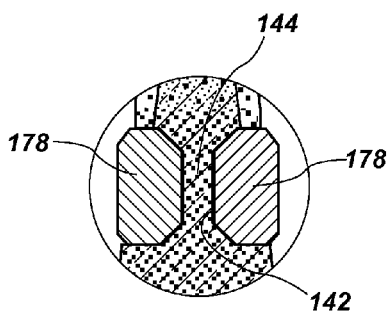
FIG. 13B is an enlarged view of area B of FIG. 13, wherein the semiconductor device structure of FIG. 13 further includes conductive material received in recessed sidewalls of a doped portion of a semiconductor feature.

With reference to FIG. 13, it is contemplated that, in some embodiments, following the formation of the separation trenches 160 (FIG. 12), remaining segments of the carrier material (e.g., carrier material 150 or 250) may be removed prior to subsequent fabrication stages to form, for example, vertical transistors, memory cells, memory arrays, or other semiconductor device structures that include the doped elements. When amorphous silicon is used as the carrier material (e.g., carrier material 150), some embodiments of the disclosed methods may include removing remaining segments of the carrier material 150. If not removed, the segments of amorphous silicon or polycrystalline silicon may otherwise include defects, compared to neighboring regions of a monocrystalline silicon material in the substrate 110. Removal of the carrier material (e.g., carrier material 150) forms a separation trench 460 defined, in part, by recesses 476 defined directly by the doped stems 144. Thereafter, conductive material 178 may be formed in the recesses 476, directly on the stems 144, as illustrated in FIG. 13B.

Figure 14:
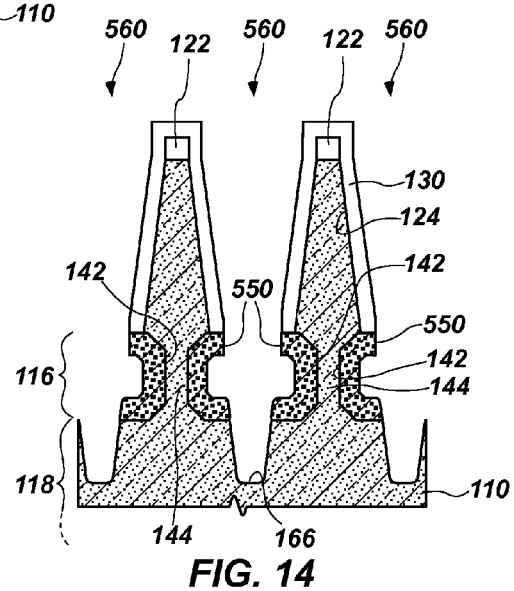
FIGS. 14 and 15 are cross-sectional, elevational, schematic illustrations of a semiconductor device structure during various stages of processing, according to an embodiment of the present disclosure in which a carrier material, comprising a dopant, is formed at least over lower exposed surfaces of the semiconductor device structure of FIG. 3 and a separation trench is formed before diffusing the dopant from the carrier material into the neighboring surfaces of the structure, the resulting semiconductor device structure including a doped element.
Figure 15:
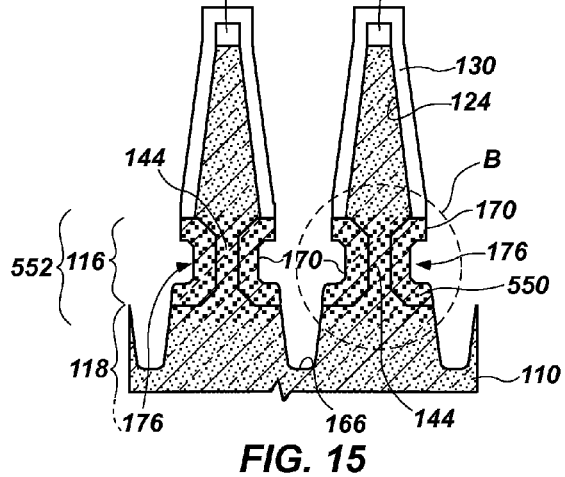
Figure 15B:
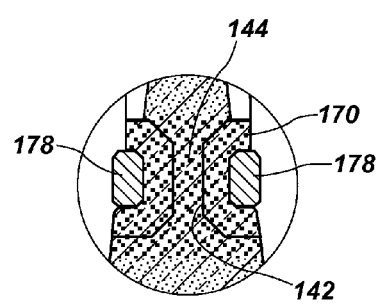
FIG. 15B is an enlarged view of area B of FIG. 15, wherein the semiconductor device structure of FIG. 15 further includes conductive material received in recessed sidewalls of a doped portion of a semiconductor feature.

Though the embodiments discussed and described above include formation of separation trenches (e.g., separation trenches 160, 260, or 460) following the thermal treatment to diffuse the dopant from the carrier material (e.g., carrier material 150 or 250) into the stems 144, in other embodiments, the separation trenches may be formed prior to the thermal treatment. For example, with reference to FIG. 14, after a carrier material 550 (e.g., including amorphous silicon, polycrystalline silicon, or monocrystalline silicon) is formed at least over exposed sidewalls 142 in the extended trenches 140 (FIG. 3), a separation trench 560 may be formed to extend into the base portion 118 of the substrate 110, leaving the carrier material 550 on only the sidewalls 142 adjacent to the stems 144. The structure of FIG. 14 may then be subjected to the thermal treatment to diffuse the dopant from the carrier material 550 into the stems 144 to form, as illustrated in FIG. 15, a dopant diffusion region 552 in at least the lower portion 116 of the substrate 110. Because, in this embodiment, the amount of dopant present in the structure during the thermal treatment may be more limited than the amount of dopant present in the structure during thermal treatment of the embodiments discussed above, the resulting dopant diffusion region 552 may be less concentrated or less extensive (e.g., spread) than the above-discussed dopant diffusion region 152 (FIG. 6), the dopant diffusion region 252 (FIG. 8), or the gradient diffusion region 390 (FIG. 12). Nonetheless, providing the carrier material 550 with the dopant proximate to a narrow stem 144 may allow doping of the stem 144 with more targeted doping and, possibly, a relatively short drive time during the thermal treatment stage compared to conventional methods. Subsequently, as discussed above, additional fabrication stages may be utilized (e.g., forming conductive material 178 in the recesses 176, as illustrated in FIG. 15B), to complete fabrication of the buried, doped, conductive elements.

Accordingly, disclosed is a method of forming a doped element of a semiconductor device structure. The method comprises forming initial trenches in a semiconductor substrate to expose sidewalls and floors in the semiconductor substrate. The method also comprises etching through the floors to form extended trenches exposing undercut sidewalls in the semiconductor substrate proximate to the floors. A doped carrier material is formed on the undercut sidewalls. The doped carrier material is exposed to heat to transfer an amount of a dopant from the doped carrier material to the undercut sidewalls.

It is contemplated that the semiconductor device structures of any of FIGS. 6, 9, 12, 13, and 15 may be utilized to form a semiconductor device incorporating a doped element (e.g., a buried, doped, conductive element comprising the conductive material 178 (FIGS. 6B, 9B, 12B, 13B, and 15B) at or proximate to the doped stem 144. For example, the region of the substrate 110 proximate to the doped stem 144 may form a lower source/drain region, of a vertical transistor, in the lower portion 116 of the substrate 110. Therein, the middle portion 114 of the substrate 110, which may or may not contain dopant in the same or less concentration than that of the stem 144, may form a channel region of the vertical transistor. The upper portion 112 of the substrate 110 may be used to form an upper source/drain region, which may, for example, be doped with a p-type dopant, if the stem 144 was doped with an n-type dopant, or may be doped with an n-type dopant, if the stem 144 was doped with a p-type dopant.

Forming conductive material 178 in opposing recesses (e.g., recesses 176 (FIGS. 6, 12, and 15), 276 (FIG. 9), 476 (FIG. 13)) on or proximate to the doped stems 144 may electrically couple opposing segments of the conductive material 178, via the doped stems 144. Accordingly, the electrically coupled conductive material 178 may function as digit lines in a memory array (i.e., an array of interconnected memory cells). The memory cells thereof may be formed as dynamic random access memory (DRAM) cells, or other memory cells.

Figure 16:
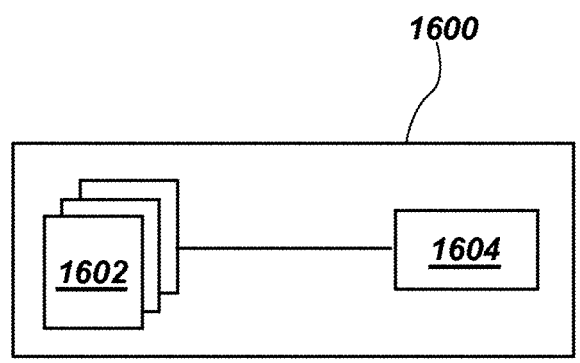
FIG. 16 is a simplified block diagram of a semiconductor device structure including an array of memory cells including doped elements formed or structured in accordance with an embodiment of the present disclosure.

With reference to FIG. 16, illustrated is a simplified block diagram of a semiconductor device structure 1600 implemented according to one or more embodiments described herein. The semiconductor device structure 1600 includes a memory array 1602 and a control logic component 1604. The memory array 1604 may include a plurality of memory cells including semiconductor device structures with doped elements (e.g., one or more of the structures of any of FIGS. 6, 6B, 9, 9B, 12, 12B, 13, 13B, 15, and 15B) formed according to any of the embodiments discussed above. The control logic component 1604 may be configured to interact with the memory array 1602 so as to read from or write to any or all memory cells within the memory array 1602.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A method of forming a doped element of a semiconductor device structure, the method comprising:
    forming trenches in a semiconductor substrate, each of the trenches comprising a lower, undercut portion defined by laterally recessed sidewalls of the semiconductor substrate;
    forming a carrier material comprising a dopant on the laterally recessed sidewalls;
    diffusing the dopant from the carrier material into the laterally recessed sidewalls of the semiconductor substrate; and
    extending a depth of the trenches to a base portion of the semiconductor substrate, the base portion being substantially free of the dopant.

2. The method of claim 1, wherein forming a carrier material comprising a dopant on the laterally recessed sidewalls comprises conformally forming the carrier material comprising the dopant on the laterally recessed sidewalls.

3. The method of claim 1, wherein forming a carrier material comprising a dopant on the laterally recessed sidewalls comprises forming at least one of amorphous silicon, polycrystalline silicon, and monocrystalline silicon on the laterally recessed sidewalls.

4. The method of claim 1, wherein forming a carrier material comprising a dopant on the laterally recessed sidewalls comprises epitaxially growing the carrier material comprising the dopant on the laterally recessed sidewalls.

5. The method of claim 1, wherein forming trenches in a semiconductor substrate comprises forming the trenches in monocrystalline silicon.

6. The method of claim 1, wherein diffusing the dopant from the carrier material into the laterally recessed sidewalls of the semiconductor substrate comprises subjecting the carrier material to a thermal treatment to drive the dopant from the carrier material into the laterally recessed sidewalls of the semiconductor substrate.

7. The method of claim 1, wherein extending a depth of the trenches comprises removing portions of the carrier material comprising the dopant.

8. The method of claim 1, further comprising, before forming the trenches in the semiconductor substrate:
    forming initial trenches in at least an upper portion of the semiconductor substrate;
    implanting another dopant into surfaces of the semiconductor substrate proximate floors of the initial trenches; and
    diffusing the another dopant into at least a middle portion of the semiconductor substrate.

9. The method of claim 8, wherein forming initial trenches in at least an upper portion of the semiconductor substrate comprises forming the initial trenches in the upper portion and the middle portion of the semiconductor substrate.

10. The method of claim 8, wherein diffusing the dopant from the carrier material into the laterally recessed sidewalls of the semiconductor substrate comprises diffusing the dopant from the carrier material into the laterally recessed sidewalls and a lower portion of the semiconductor substrate.

11. The method of claim 1, further comprising forming a conductive material on the carrier material.

12. A method of forming a doped element of a semiconductor device structure, the method comprising:
    forming a plurality of semiconductor features each comprising a stem between a base portion and an overlying broader portion;
    forming a carrier material comprising a dopant on sidewalls of each stem of the plurality of semiconductor features;
    diffusing the dopant from the carrier material into each stem of the plurality of semiconductor features to form a plurality of doped stems; and
    removing segments of the base portion of the plurality of semiconductor features to isolate each doped stem of the plurality of doped stems from a neighboring doped stem of the plurality of doped stems.

13. The method of claim 12, wherein forming a carrier material comprising a dopant on sidewalls of each stem of the plurality of semiconductor features comprises forming silicon doped with the dopant to saturation on the sidewalls of each stem of the plurality of semiconductor features.

14. The method of claim 12, wherein forming a carrier material comprising a dopant on sidewalls of each stem of the plurality of semiconductor features comprises forming the carrier material comprising a dopant comprising at least one of arsenic and phosphorous.

15. The method of claim 12, wherein forming a carrier material comprising a dopant on sidewalls of each stem of the plurality of semiconductor features comprises forming the carrier material comprising the dopant to a thickness of about 5 nanometers on the sidewalls of each stem of the plurality of semiconductor features.

16. The method of claim 12, further comprising forming a conductive material at least partially recessed within the carrier material or within sidewalls of the doped stems of the plurality of doped stems.

17. A method of forming a doped element of a semiconductor device structure, the method comprising:
- forming initial trenches in a semiconductor substrate to expose sidewalls and floors in the semiconductor substrate;
- etching through the floors to form extended trenches exposing undercut sidewalls in the semiconductor substrate proximate to the floors;
- forming a doped carrier material on the undercut sidewalls;
- exposing the doped carrier material to heat to transfer an amount of a dopant from the doped carrier material to the undercut sidewalls; and
- removing portions of the doped carrier material to expose separation trench floors in the semiconductor substrate, the separation trench floors being substantially free of the dopant.

* * * * *